United States Patent
Cox et al.

[11] Patent Number: 5,991,529
[45] Date of Patent: Nov. 23, 1999

[54] TESTING OF HARDWARE BY USING A HARDWARE SYSTEM ENVIRONMENT THAT MIMICS A VIRTUAL SYSTEM ENVIRONMENT

[75] Inventors: Steven R. Cox, San Jose; Harry M. Chue, Alameda, both of Calif.

[73] Assignees: Sony Corporation, Tokyo, Japan; Sony Electronics Inc., Park Ridge, N.J.

[21] Appl. No.: 08/857,154

[22] Filed: May 16, 1997

[51] Int. Cl.⁶ .................................................. G06F 9/455
[52] U.S. Cl. .............................. 395/500.3; 395/500.34; 395/500.35
[58] Field of Search .............................. 395/500; 364/578

[56] References Cited

U.S. PATENT DOCUMENTS

| | | | |
|---|---|---|---|
| 4,638,246 | 1/1987 | Blank et al. | 324/73 R |
| 4,744,084 | 5/1988 | Beck et al. | 371/23 |
| 4,768,196 | 8/1988 | Jou et al. | 371/25 |
| 4,811,345 | 3/1989 | Johnson | 371/16 |
| 4,937,770 | 6/1990 | Samuels et al. | 364/578 |
| 4,945,503 | 7/1990 | Takasaki | 364/578 |
| 5,109,353 | 4/1992 | Sample et al. | 364/578 |
| 5,134,701 | 7/1992 | Mueller et al. | 395/500 |
| 5,146,460 | 9/1992 | Ackerman et al. | 371/23 |
| 5,235,530 | 8/1993 | Herz et al. | 364/578 |
| 5,329,470 | 7/1994 | Sample et al. | 364/578 |
| 5,371,878 | 12/1994 | Coker | 395/500 |
| 5,438,673 | 8/1995 | Court et al. | 395/500 |
| 5,477,475 | 12/1995 | Sample et al. | 364/578 |
| 5,546,562 | 8/1996 | Patel | 395/500 |

OTHER PUBLICATIONS

Srivastava & Palavali, "Integration of SPICE with TEK LV511 ASIC Design Verification System," IEEE Proceedings of the 36th Midwest Symposium on Circuits and Systems, pp. 673–676, 1993.

*Primary Examiner*—Kevin J. Teska
*Assistant Examiner*—Samuel Broda
*Attorney, Agent, or Firm*—Haverstock & Owens LLP

[57] ABSTRACT

A technique for testing a hardware implementation of an integrated circuit design using test algorithms developed for testing a software model of the integrated circuit design. A software model is created for a design of the integrated circuit. The software model is a software algorithm that emulates behavior of the integrated circuit. In addition, a virtual environment for the software model is also constructed. The virtual environment is a software algorithm that emulates an actual environment anticipated for the integrated circuit. Diagnostic tests are performed on the software model while it is operating in the virtual environment. These tests are used to verify and analyze the design for the integrated circuit. Based upon the results of the diagnostic tests, the design is modified as necessary. Once the design for the integrated circuit has been verified by testing the software model, an actual hardware circuit is constructed that implements the software model. In addition, an actual hardware environment is constructed that implements the virtual environment. Accordingly, the software model and the virtual environment are transformed into equivalent hardware circuits. Because of the equivalency between the software model and the hardware circuit and between the virtual environment with the hardware environment, the same diagnostic tests that were used to verify and analyze the software model in the virtual environment can be used to verify and analyze the hardware circuit in the hardware environment. This results in good test coverage for the integrated circuit design and reduced expense for developing the diagnostic tests.

11 Claims, 3 Drawing Sheets

TESTING OF HARDWARE BY USING A HARDWARE SYSTEM ENVIRONMENT THAT MIMICS A VIRTUAL SYSTEM ENVIRONMENT

FIELD OF THE INVENTION

The present invention relates to the field of integrated circuit design, simulation and testing. More particularly, the present invention relates to an improved technique for testing a hardware implementation of an integrated circuit design using test algorithms developed for verifying a software simulation of the integrated circuit design.

BACKGROUND OF THE INVENTION

Designing an integrated circuit typically involves creating a software model for the integrated circuit. The software model is a software algorithm that emulates the behavior of a design for the integrated circuit. To analyze and verify the design, diagnostic tests can be performed on the software model and, based upon the results, the design can be modified. Using a software model allows the design for the integrated circuit to be analyzed and verified before the integrated circuit is actually implemented in hardware. This is especially advantageous when the integrated circuit has a high density of logic elements and a broad range of functions which can make the integrated circuit relatively expensive to implement in hardware.

After the design for the integrated circuit has been verified using the software model, the design is implemented in hardware. Preferably, the hardware implementation is also tested to ensure that it performs as expected. Due to differences between the software model and the hardware implementation, such as in speed of processing capability, and differences in how each interacts with its respective environment, diagnostic tests utilized for testing the software implementation are generally not applicable for testing the hardware implementation, model and for testing the hardware implementation. This approach is disadvantageous due to the time and expense required to formulate these separate tests. In addition, because separate diagnostic tests are utilized, their results can be difficult to correlate, thus, making the debugging process difficult and time consuming.

Court et al., in U.S. Pat. No. 5,483,673, entitled: "Automatic Interface For CPU Real Machine and Logic Simulator Diagnostics" suggest the desirability of re-using diagnostics that exist for testing hardware of a prior generation of a system design for testing a software simulation of a next generation of the design. Court et al. recognize, however, that doing so is not practical because the software simulation runs on the order of a million times slower than the actual hardware. Therefore, Court et al. teach a method to speed up the execution of diagnostics in software simulations. The method involves identifying those functions which should be run on the real-machine and those that need to be run on the software simulator; executing those functions that must be run in the software simulator in the software simulator, while executing at least some of those functions that may be run on the real-machine on the real-machine; and coordinating the functions executed between the real-machine and the simulator to provide a diagnostic check-out of the system.

The approach taken by Court et al. has a drawback in that it assumes, as a starting point, that diagnostics for testing the hardware implementation already exist as having been developed for a previous generation of the system design and also assumes that the prior hardware also exists. Depending upon the differences between the prior design and the new design, however, modifications to the prior diagnostics could be required and, when a completely new system is designed, no such diagnostics will exist. Further, the method requires coordinating results obtained from testing portions of the simulation with results obtained from testing portions of the hardware, which could increase the difficulty of determining the source of faults.

Therefore, what is needed is an improved technique for testing a software model of a design for an integrated circuit and for testing a hardware implementation of the design that does not have the disadvantages associated with the prior art. In particular, what is needed is a technique for testing a software model of a design for an integrated circuit that does not require separate diagnostic tests for the software model and for the hardware implementation and that does not depend upon the existence of a prior generation of the design.

SUMMARY OF THE INVENTION

The invention is a technique for testing a hardware implementation of an integrated circuit design using test algorithms developed for testing a software model of the integrated circuit design. A software model is created for a design of the integrated circuit. The software model is a software algorithm that emulates behavior of the integrated circuit under design. In addition, a virtual environment for the software model is also constructed. The virtual environment is a software algorithm that emulates an actual environment anticipated for the integrated circuit. A series of diagnostic tests are performed on the software model while it is operating in the virtual environment. These tests are used to verify and analyze the design for the integrated circuit. Based upon the results of the diagnostic tests, the design can be modified as necessary.

Once the design for the integrated circuit has been verified by testing the software model, an actual hardware circuit is constructed that implements the software model. In addition, an actual hardware environment is constructed that implements the virtual environment. Accordingly, the software model and the virtual environment are transformed into equivalent hardware circuits. Because of the equivalency between the software model and the hardware circuit and between the virtual environment with the hardware environment, the same diagnostic tests that were used to verify and analyze the software model in the virtual environment can be used to verify and analyze the hardware circuit in the hardware environment. This results in good test coverage for the integrated circuit design and reduced expense for developing the diagnostic tests.

DETAILED DESCRIPTION

Figure 1:
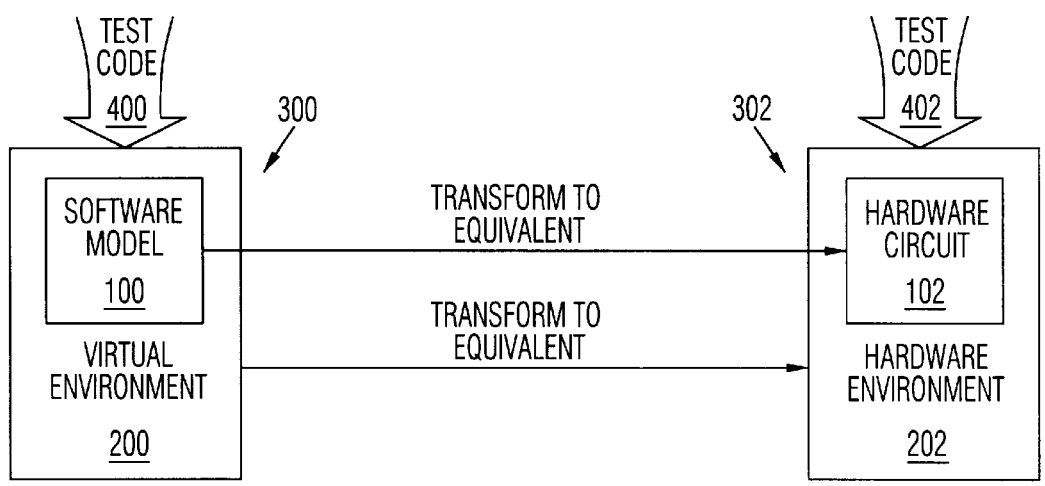
FIG. 1 illustrates a block schematic diagram of the present invention.

FIG. 1 illustrates a block schematic diagram of the present invention. A software model 100 is illustrated in a virtual environment 200. The software model 100 is a software program that runs on a host computer system (not shown) and that emulates a design for a hardware circuit 102. For example, the design can be for an integrated circuit, such as a microprocessor, a controller, a logic device or a finite state machine. The virtual environment 200 is a software program that also runs on the host computer system and that emulates a design for a hardware environment 202 for the hardware circuit 102. For example, if the design is for an integrated circuit microprocessor, the virtual environment 200 will generally emulate memory devices, their associated memory maps, input/output devices, input/output port addresses, various registers and their associated register definitions, but could emulate a wide variety of devices and parameters associated with the anticipated environment external to the circuit under design. Together, the software model 100 and the virtual environment 200 form a virtual system 300.

A step in the design of the hardware circuit 102 is to generate the software model 100 for the design and the virtual environment 200 by appropriately programming the host computer system. Test code 400 is developed which provides stimulus for the software model 100 to execute instructions within the virtual environment 200 and to provide an indication of whether the operations were performed as expected. For example, a test can include the software model 100 loading a sequence of bits into a virtual memory device located in the virtual environment 200 according to a particular algorithm, retrieving the bits, and then examining the bits to determine if the values were loaded and retrieved correctly. Thus, the virtual environment 200 is necessary to test functions of the software model 100 that involve interaction of the design for the hardware circuit with its environment.

Preferably, the test code 400 includes a wide variety of diagnostic tests that can be selectively performed so that the design for the hardware circuit can be thoroughly analyzed and verified. The design can be modified by making corresponding changes to the software model 100 if the results are not satisfactory.

Once the software model 100 is completely debugged, the software model 100 is transformed into an equivalent hardware circuit 102 by any known means. The equivalent hardware circuit 102 can be constructed using programmable logic, interconnected logic modules, discrete components or can be a completely integrated hardware implementation of the design. It is important, however, that the hardware circuit 102 is equivalent to the software model 100 in that the hardware circuit 102 provides functionality that is equivalent to the functionality of the software model 100. In addition, the virtual environment 200 is transformed into an equivalent hardware environment 202 for the hardware circuit 102. The hardware environment 202 can include various types of memory devices, registers, input/output ports and devices, co-processors, power supplies, and the like. It is important that the hardware environment provides functionality that is equivalent to the functionality of the virtual environment 200. Together, the hardware circuit 102 and the hardware environment 202 form a hardware system 302.

It is important that a logical distinction can be drawn between the software model 100 and the virtual environment 200 so that when they are transformed into the equivalent hardware circuit 102 and into the equivalent hardware environment 202, respectively, a physical distinction can be drawn between the hardware circuit 102 and its hardware environment 202. Maintaining such logical and physical distinctions will facilitate the process of isolating and correcting any faults located during the process of analyzing and verifying the design. In addition, maintaining such a physical distinction will enable the design for the hardware circuit 102 to be separated from the design for the hardware environment 202 for manufacturing the hardware circuit 102.

Figure 2:
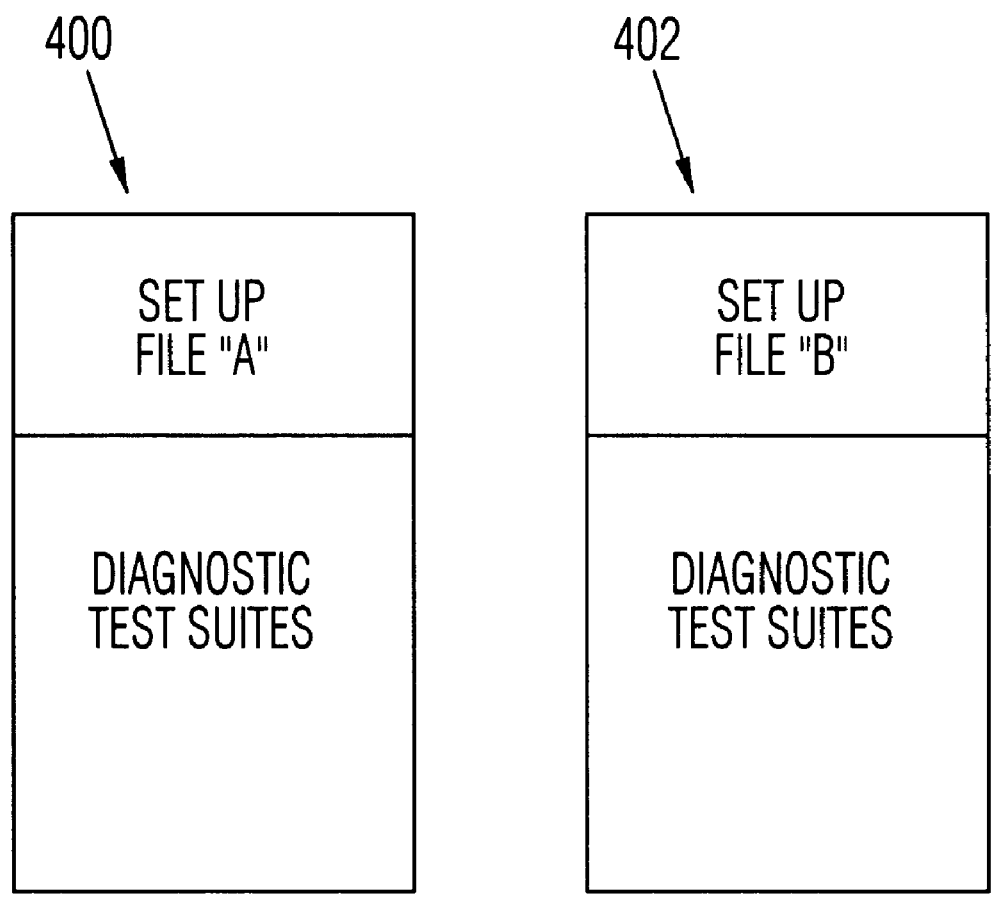
FIG. 2 contrasts test code utilized for verifying a software model with test code utilized for verifying a hardware circuit.

FIG. 2 contrasts the test code 400 utilized for verifying the software model 100 with the test code 402 utilized for verifying the hardware circuit 102. Because the hardware circuit 102 and hardware environment 202 are functionally equivalent to the software model 100 and the virtual environment 200, respectively, the test code 400 used to verify and analyze the software model 100 can be utilized to verify the hardware circuit 102 with few changes. As can be seen from FIG. 2, the test code 400 differs from the test code 402 in that the set up program "A" which includes syntax or specific commands required to initialize the host computer system and to instruct the host computer system to execute appropriate test suites will likely differ from the set up program "B" which includes syntax or specific commands required to initialize the hardware circuit 102 and the hardware environment 202 to execute the identical test suites. This is because any software overhead ("glue code") associated with the host computer system will no longer be required, but different overhead ("glue code") associated with the hardware circuit 102 and hardware environment 202 will be needed. Therefore, the test code 400 has a different set up file than the test code 402.

The diagnostic test suites contained within the test code 402 which provide stimulus to the hardware circuit 102 and which examine results obtained, however, can be essentially identical to the diagnostic test suites contained within the test code 400. This is advantageous because the diagnostic test suites provide a consistent and uniform means for verifying both the software model 100 and the hardware circuit 102. In other words, diagnostic test suites provide a uniform "yardstick" by which the performance of the software model 100 and the hardware circuit 102 can both be measured.

Preferably, the diagnostic test suites of the test code 400 and 402 can be run in a batch mode or in an interactive mode. In batch mode, a predefined set of diagnostic tests are performed and the results obtained. In interactive mode, a test can be halted at selected points in its operation and register activity, internal signal activity or external signal activity, can be observed and analyzed. Batch mode is generally used to ensure that the design performs properly after a change is made, while interactive mode is generally used to isolate faults. In addition, a monitor mode is preferably provided which allows specific addresses to be monitored, such as program execution addresses, to determine whether a test was failed, passed, or resulted in a hang state. Once a test has been completed, the results are obtained, compared to expected results and a pass/fail determination is made. The results will then be logged to a display and stored in a designated memory file.

In addition, specific parameters of the virtual environment 200 and of the hardware environment 202 can preferably be selectively configured before running a diagnostic test suite. The virtual environment 200 can be appropriately initialized through its set up file and the hardware environment 202 can also be configured via a similar setup file or by appropriately setting dip switches. Preferably, the virtual environment 200 and the hardware environment 202 are configured in a like manner to maintain their functional equivalence, but could be configured differently for testing purposes. The selective configuration parameters can include: assigning memory segments for particular operations, controlling a number of wait states used for access to each memory segment, controlling a system clock frequency, enabling parity checking functions, enabling direct memory access (DMA) functions, enabling random DMA requests, enabling random external interrupts, controlling cache burst refill sizes, selecting which cache burst word is to be retried, and controlling power supply voltage levels. It will be apparent that other parameters can be controlled or enabled depending upon the functions of a particular hardware circuit under design.

Figure 3:
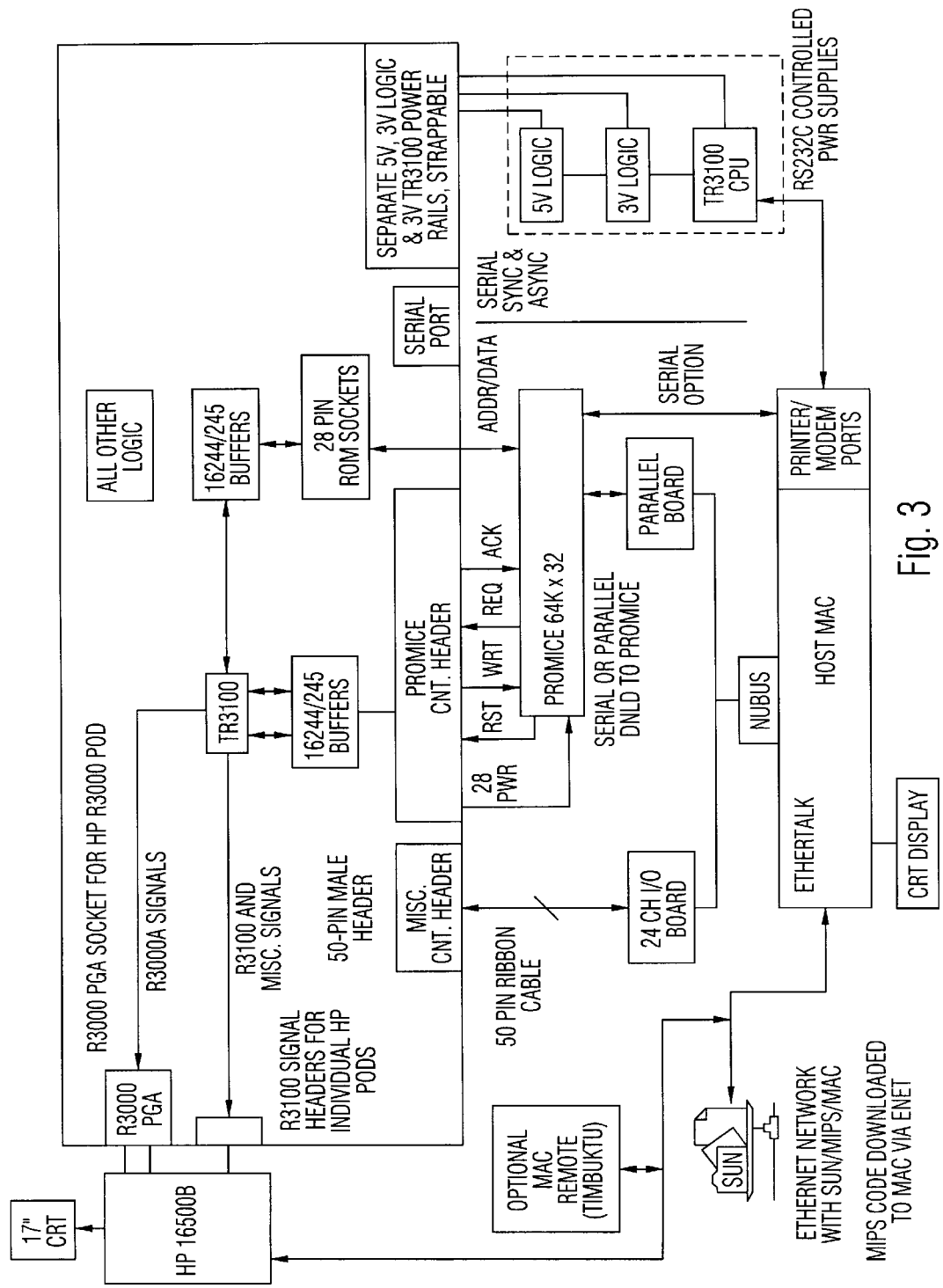
FIG. 3 illustrates a block schematic diagram of an exemplary hardware environment utilized to verify a design for an integrated circuit processor TR3100.

FIG. 3 illustrates a block schematic diagram of an exemplary hardware environment utilized to verify a design for an integrated circuit processor TR3100. The hardware environment illustrated in FIG. 3 provides capability to operate the integrated circuit processor TR3100 over its full range of functionality using the same diagnostic test suites developed for verifying a software model of the design for the integrated circuit processor TR3100.

The present invention has been described in terms of specific embodiments incorporating details to facilitate the understanding of the principles of construction and operation of the invention. Such reference herein to specific embodiments and details thereof is not intended to limit the scope of the claims appended hereto. It will be apparent to those skilled in the art that modifications may be made in the embodiment chosen for illustration without departing from the spirit and scope of the invention. Specifically, it will be apparent to one of ordinary skill in the art that the device of the present invention could be implemented in several different ways and the apparatus disclosed above is only illustrative of the preferred embodiment of the invention and is in no way a limitation.

What is claimed is:

1. An apparatus for verifying a design for a hardware circuit, the apparatus comprising:
   a. a virtual system, wherein the virtual system comprises a host computer system programmed according to a first software program for causing the host computer to emulate the design for the hardware circuit;
   b. a first test program for stimulating the virtual system to execute a function wherein the first test program comprises a first set up file and a first diagnostic test;
   c. a hardware system, wherein the hardware system is functionally equivalent to the virtual system and wherein a parameter of the hardware system is selectively configured according to a parameter contained in the first set up file; and
   d. a second test program for stimulating the hardware system to execute a function wherein the second test program comprises a second set up file and second diagnostic test and wherein the second diagnostic test is identical to the first diagnostic test.

2. The apparatus according to claim 1 wherein the virtual system is logically divisible into a software model of the design and into a virtual environment for the software model.

3. The apparatus according to claim 2 wherein the hardware system is physically divisible into a hardware circuit having equivalent functionality to the software model and into a hardware environment having equivalent functionality to the virtual environment.

4. The apparatus according to claim 1 wherein the parameter of the hardware system is selected from the group consisting of: assigning a memory segment for a particular function, selecting a number of wait states used for accessing a memory segment, controlling a system clock frequency, enabling a parity checking function, enabling a DMA function, enabling a DMA request, enabling a random external interrupt, controlling a cache burst refill size, selecting a cache burst word to be retried, and controlling a power supply voltage.

5. An apparatus for verifying a design for a hardware circuit, the apparatus comprising:
   a. a software model for the design, wherein the software model is a first software program for causing a host computer to emulate the design;
   b. a virtual environment wherein the virtual environment is a second software program for causing the host computer to emulate an environment for the design;
   c. a first test program for stimulating the software model to execute a function within the virtual environment wherein the first test program comprises a first set up file and a first diagnostic test;
   d. a hardware circuit for the design, wherein the hardware circuit is functionally equivalent to the software model;
   e. a hardware environment operatively coupled to the hardware circuit, wherein the hardware environment is functionally equivalent to the virtual environment; and
   f. a second test program for stimulating the hardware model to execute a function within the hardware environment wherein the second test program comprises a second set up file and second diagnostic test and wherein the second diagnostic test is identical to the first diagnostic test.

6. The apparatus according to claim 5 wherein the first set up file differs from the second set up file according to differences between initialization requirements of the virtual environment and initialization requirements of the hardware environment.

7. The apparatus according to claim 5 wherein the hardware environment is selectively configured according to a parameter contained in the first set up file.

8. A method of verifying a design for a hardware circuit, the method comprising steps of:
   a. constructing a software model, wherein the software model is a first software algorithm which emulates the design for the hardware circuit;
   b. constructing a virtual environment for interacting with the software model, wherein the virtual environment is a second software algorithm which emulates an environment for the design for the hardware circuit;
   c. testing the software model by performing a diagnostic test on the software model;
   d. constructing a hardware circuit which is functionally equivalent to the software model;
   e. constructing a hardware environment operatively coupled to the hardware circuit wherein the hardware environment is functionally equivalent to the virtual environment; and
   f. testing the hardware circuit by performing the diagnostic test on the hardware circuit.

9. The method according to claim 8 further comprising a step of integrating the hardware circuit into a single chip.

10. The method according to claim 8 further comprising steps of:
    a. initializing the software model according to a first set up file before testing the software model; and
    b. initializing the hardware circuit according to a second set up file before testing the hardware circuit.

11. The method according to claim 10 further comprising a step of configuring the hardware environment according to a predetermined parameters before testing the hardware circuit.

* * * * *